US007151980B2

(12) United States Patent
You et al.

(10) Patent No.: US 7,151,980 B2
(45) Date of Patent: Dec. 19, 2006

(54) TRANSPORT MANAGEMENT SYSTEM AND METHOD THEREOF

(75) Inventors: James You, Hsinchu (TW); Shen-Jr Jang, Taiping (TW); King-Chuan Sun, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 161 days.

(21) Appl. No.: 10/811,255

(22) Filed: Mar. 26, 2004

(65) Prior Publication Data
US 2005/0216115 A1 Sep. 29, 2005

(51) Int. Cl.
G06F 7/00 (2006.01)
(52) U.S. Cl. .................. 700/214; 700/215; 700/225
(58) Field of Classification Search ............... 700/213, 700/214, 215, 225, 228, 112
See application file for complete search history.

(56) References Cited

U.S. PATENT DOCUMENTS 6,122,566 A * 9/2000 Nguyen et al. ............ 700/218
6,138,058 A * 10/2000 Van Antwerp et al. ..... 700/225
6,259,961 B1 * 7/2001 Inoue et al. ................ 700/112
6,308,107 B1 * 10/2001 Conboy et al. ............. 700/121
6,519,498 B1 * 2/2003 Jevtic et al. ................ 700/101
6,594,546 B1 * 7/2003 Elger .......................... 700/225
6,748,282 B1 * 6/2004 Lin .............................. 700/95
6,845,294 B1 * 1/2005 Jevtic et al. ................ 700/228
6,887,358 B1 * 5/2005 Elger ..................... 204/298.35

* cited by examiner

Primary Examiner—Khoi H. Tran
(74) Attorney, Agent, or Firm—Thomas, Kayden, Horstemeyer & Risley

(57) ABSTRACT

A system and method for carrier transport traffic management. A host computer connects to a fabrication tool, configured to acquire an available number of a resource type for the fabrication tool upon detecting a fabrication tool loadport of the fabrication tool is available. A material transport system connects to the host computer, receives the available number of a resource type for the fabrication tool, acquires a carrier identity corresponding to a carrier, acquires a required number of the resource type corresponding to the carrier, and issues a load command to an automated material handling system (AMHS) to transport the carrier to the fabrication tool if the available number of the resource type exceeds or equals to the required number of the resource type.

20 Claims, 5 Drawing Sheets

TRANSPORT MANAGEMENT SYSTEM AND METHOD THEREOF

BACKGROUND

The present invention relates to transport management technology, and more particularly, to a method and system of transport management in wafer fabrication.

A conventional semiconductor factory typically includes requisite fabrication tools to process semiconductor wafers for a particular purpose, employing processes such as photolithography, chemical-mechanical polishing, or chemical vapor deposition. During manufacture, the semiconductor wafer passes through a series of process steps, performed by various fabrication tools. For example, in the production of an integrated semiconductor product, the semiconductor wafer can pass through up to 600 process steps.

The wafers are typically stored in containers, such as cassettes, each of which holds up to 25 wafers. The cassettes are then loaded in carriers, such as standard mechanical interfaces (SMIFs) or front opening unified pods (FOUPs) for transport throughout the factory. A carrier may contain multiple wafer lots to undergo a fabrication task. An automated material handling system (AMHS) is employed to move carriers containing wafer lots from one location to another based on instructions from the MES in a 300 mm fab. Wafer carriers are typically input to the AMHS using automated equipment. Automated equipment is also used to remove wafer carriers using the fabrication tool loadport as the exit point, with the AMHS and/or removal equipment designed to allow several wafer carriers to accumulate near locations while preventing collisions between adjacent wafer carriers. A material transfer system (MTS) connects to a plurality of host computers and each host computer connects to a plurality of fabrication tools. An equipment automation program (EAP) is embedded in the host computer for transferring messages and issuing commands between the MTS and the fabrication tool. The MTS follows a series of standard procedural steps to issue commands to the AMHS, and the AMHS transfers wafer carriers accordingly.

In regular use, a host computer issues a carrier loading command to the MTS upon receiving a ready to load (RTL) event from a fabrication tool, and the MTS follows procedural steps to direct the AMHS to move relevant carriers to the fabrication tool loadport. After loading wafers, the fabrication tool performs a fabrication operation thereon. The host computer issues a carrier unload command to the MTS upon receiving a ready to unload (RTU) event from the fabrication tool, and the MTS directs the AMHS to move the carriers from the fabrication tool loadport.

The conventional transport process entails several limitations often associated with lack of process resource, such as control job, process job space, internal buffer capacity, or others. In one situation, a carrier may be stocked in a fabrication tool once wafer lots therein acquire insufficient control job or process job space. The AMHS removes carriers from the fabrication tool until an operator issues a carrier unload command to the MTS via the host computer, decreasing the fabrication tool utility. In another situation, a carrier containing wafer lots not having undergone a fabrication operation is cyclically loaded into and removed from a fabrication tool with internal buffer by the AMHS once the fabrication tool possesses insufficient space of the internal buffer. The AMHS stops cyclic transport until the carrier is capable of acquiring sufficient space in the internal buffer, decreasing AMHS efficacy.

In view of these limitations, a need exists for a system and method of wafer transport traffic management that preemptively determines whether the fabrication tool has access to requisite resources, thereby increasing fabrication tool and AMHS efficacy.

SUMMARY

It is therefore an object of the present invention to provide a system and method of wafer transport traffic management that preemptively determines whether the fabrication tool has access to requisite resources, thereby increasing fabrication tool and AMHS efficacy.

According to an embodiment of the invention, the system includes a material transport system (MTS), host computers, and fabrication tools. The MTS connects to the host computers, and each host computer connects to the fabrication tool respectively.

The fabrication tool typically performs a single wafer fabrication task on the wafers in a given lot. A process job is provided for association with one or more wafer lots and to specify a particular recipe, and a control job with relevant priority is provided to manage process job sequence. The fabrication tool may be fixed buffer equipment, in which a loadport bolted onto the outside of the tool interfaces with an automated material handling system (AMHS) to load carriers back and forth for processing. The fabrication tool may also be internal buffer equipment, such as diffusion furnaces, wet benches, or others, which intake, process and store carriers via a carrier buffer or mini-stocker. When the loadport of the fabrication tool is available, a ready to load (RTU) event indicating the fabrication tool is ready to load carriers is reported to the host computer.

The host computer acquires available resource information, such as process job, control job, internal buffer space, or others from the fabrication tool upon receiving a RTU event or detecting RTU status of the loadport. The available process job, control job and/or internal buffer space is transmitted to the MTS.

The object of the MTS is to receive available resource information for a fabrication tool from the host computer, acquire both an anticipative carrier and required resource information thereof corresponding to the fabrication tool, issue a load command to an automated material handling system (AMHS) when a corresponding fabrication tool has access to requisite resources for the carrier, and conversely, issue an advisory to an operator or an automated dispatch system when the fabrication tool has access to insufficient resources, thus preventing unnecessary transport.

BRIEF DESCRIPTION OF THE DRAWINGS

The aforementioned objects, features and advantages of this invention will become apparent by referring to the following detailed description of the preferred embodiment with reference to the accompanying drawings, wherein.

DESCRIPTION

Figure 1:
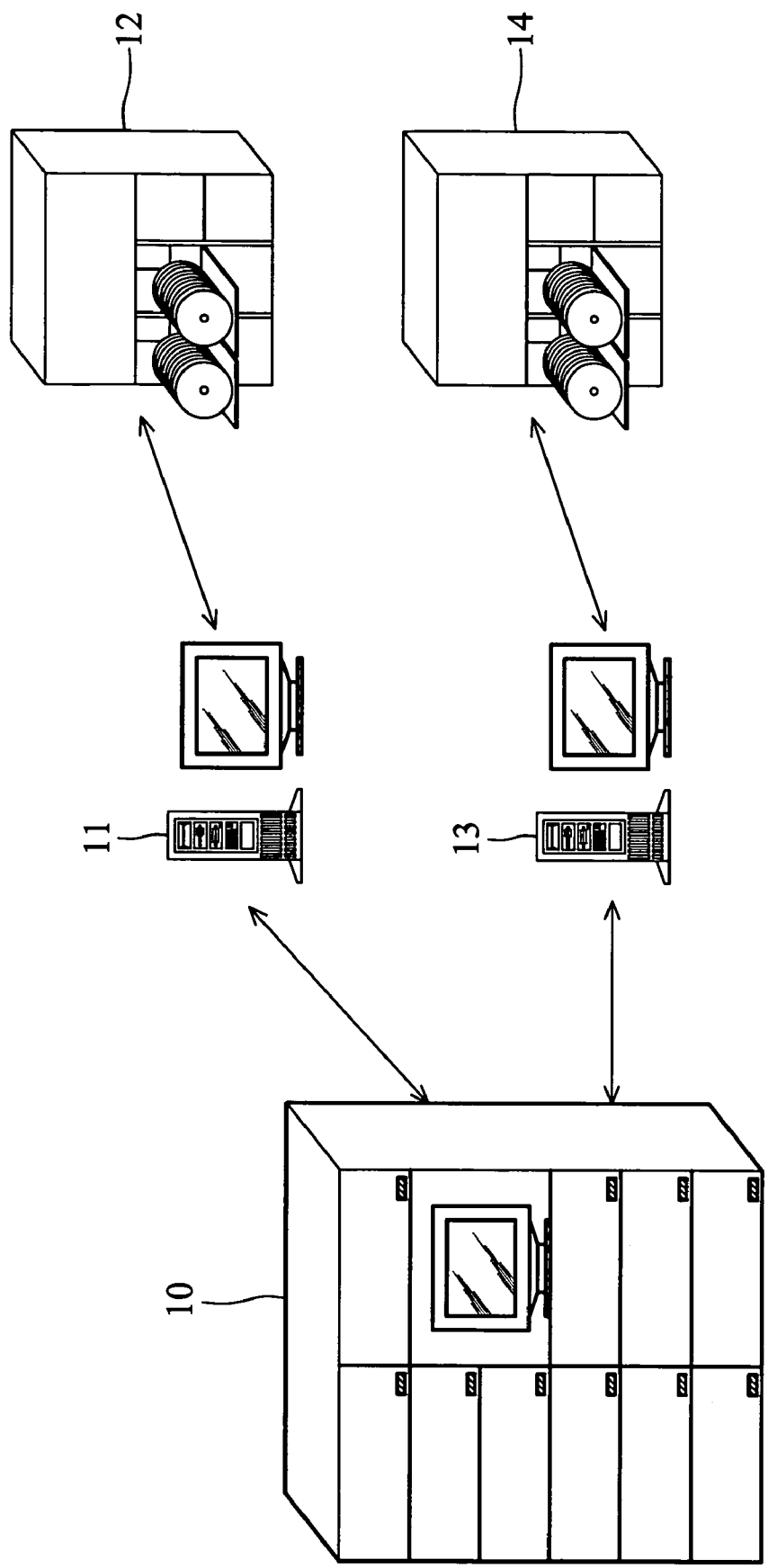
FIG. 1 is a diagram of the architecture of the carrier transport traffic management system according to one embodiment of the present invention.

FIG. 1 is a diagram of the architecture of the carrier transport traffic management system according to one embodiment of the present invention. According to the invention, the system preferably includes a material transport system (MTS) 10, host computers 11 and 13, and fabrication tools 12 and 14. The MTS 10 connects to host computers 11 and 13, and each host computer connects to fabrications tool 12 and 14 respectively.

Fabrication tools 12 and 14 typically perform a single wafer fabrication task on the wafers in a given lot. For example, a particular fabrication tool may perform layering, patterning, doping, implanting or heat treatment operations. Fabrication tools 12 and 14 preferably provide software services compliant to 300 mm semiconductor equipment and material international (SEMI) standards specifying transport protocol, message format and functionality. A process job is provided for association with one or more wafer lots and to specify a particular recipe, and a control job with relevant priority is provided to manage process job sequence. Fabrication tool 12 is a fixed buffer equipment, in which a loadport bolted onto the outside of the tool interfaces with an automated material handling system (AMHS) (not shown) to load carriers back and forth for processing. Fabrication tool 14 is an internal buffer equipment, such as diffusion furnace, wet bench, or others, which intake, process and store carriers via a carrier buffer or mini-stocker. When the loadport of the fabrication tool 12 or 14 is available, a ready to load (RTU) event, such as "E87:ReadyToLoad" or other, according to SEMI, is issued to host computers 11 and 13 respectively.

Host computer 11 acquires available process job and control job space from the fabrication tool 12 by respectively executing an E40 service according to 300 mm SEMI standard, such as "E40:S16F21_AvailPJSpace", or other, and an E94 service, such as "E94:SV S1F3_AvailCJSpace", or other, upon receiving a RTU event or detecting RTU status of the loadport. The available process job and control job space is transmitted to the MTS 10.

Similarly, the host computer 13 also acquires available process job and control job space from the fabrication tool 14, upon receiving a RTU event or detecting RTU status of the loadport. The host computer 13 additionally acquires available space of the internal buffer with buffer type, such as production, side dummy, fill dummy or others, by acquiring an E87 variable according to 300 SEMI standard, such as "E87:S1F3_BufferCapacityList", "E87:S1F3_CarrierLocationMatrix", or other. The information containing available process job, control job and internal buffer space is transmitted to the MTS 10.

Figure 2:
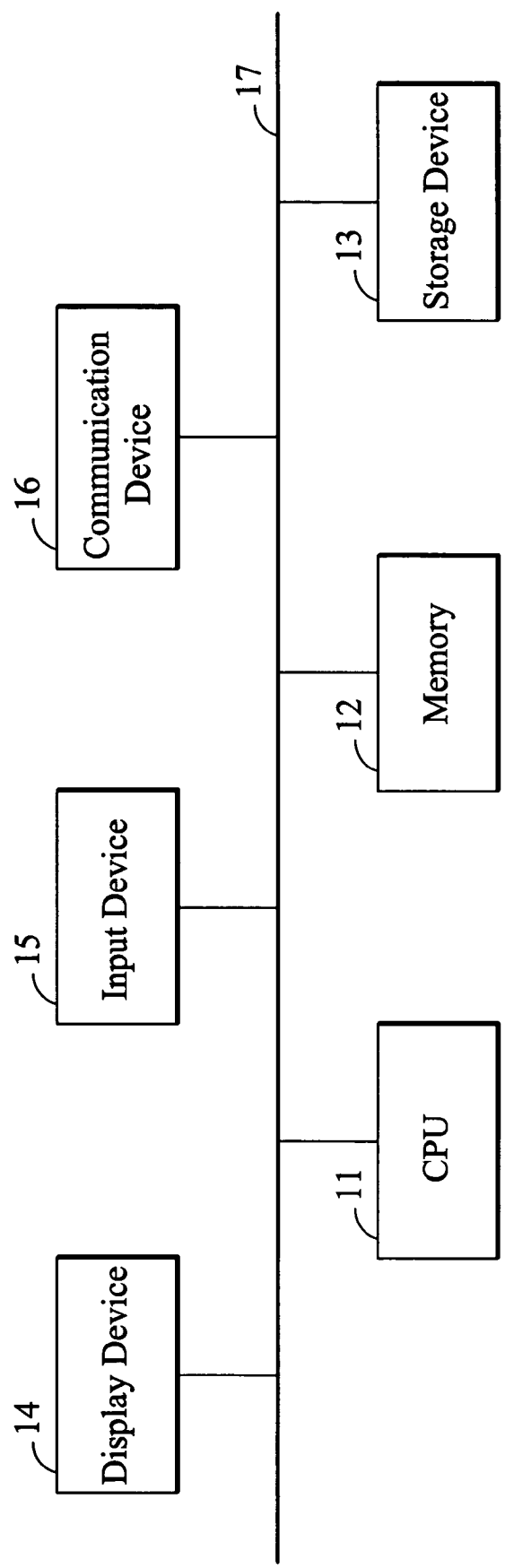
FIG. 2 is a diagram of the architecture of the material transport system according to one embodiment of the present invention.

FIG. 2 is a diagram of the architecture of the material transport system according to the present invention. The MTS 10 includes a central processing unit (CPU) 11, a memory 12, a storage device 13, an input device 14, a display device 15 and a communication device 16. The CPU 11 is connected by buses 17 to the memory 12, storage device 13, input device 14, display device 15 and communication device 16 based on Von Neumann architecture. The CPU 11, memory 12, storage device 13, display device 14, input device 15 and communication device 16 may be conventionally coupled to a mainframe computer, a minicomputer, a workstation computer, a host computer, a personal computer, or a mobile computer.

The CPU 11, controlled by instructions from the memory 12 and an operator through the input device 14, executes job queue management functions. The storage device 13 can be implemented as a database system, a file, or the like.

Figure 3:
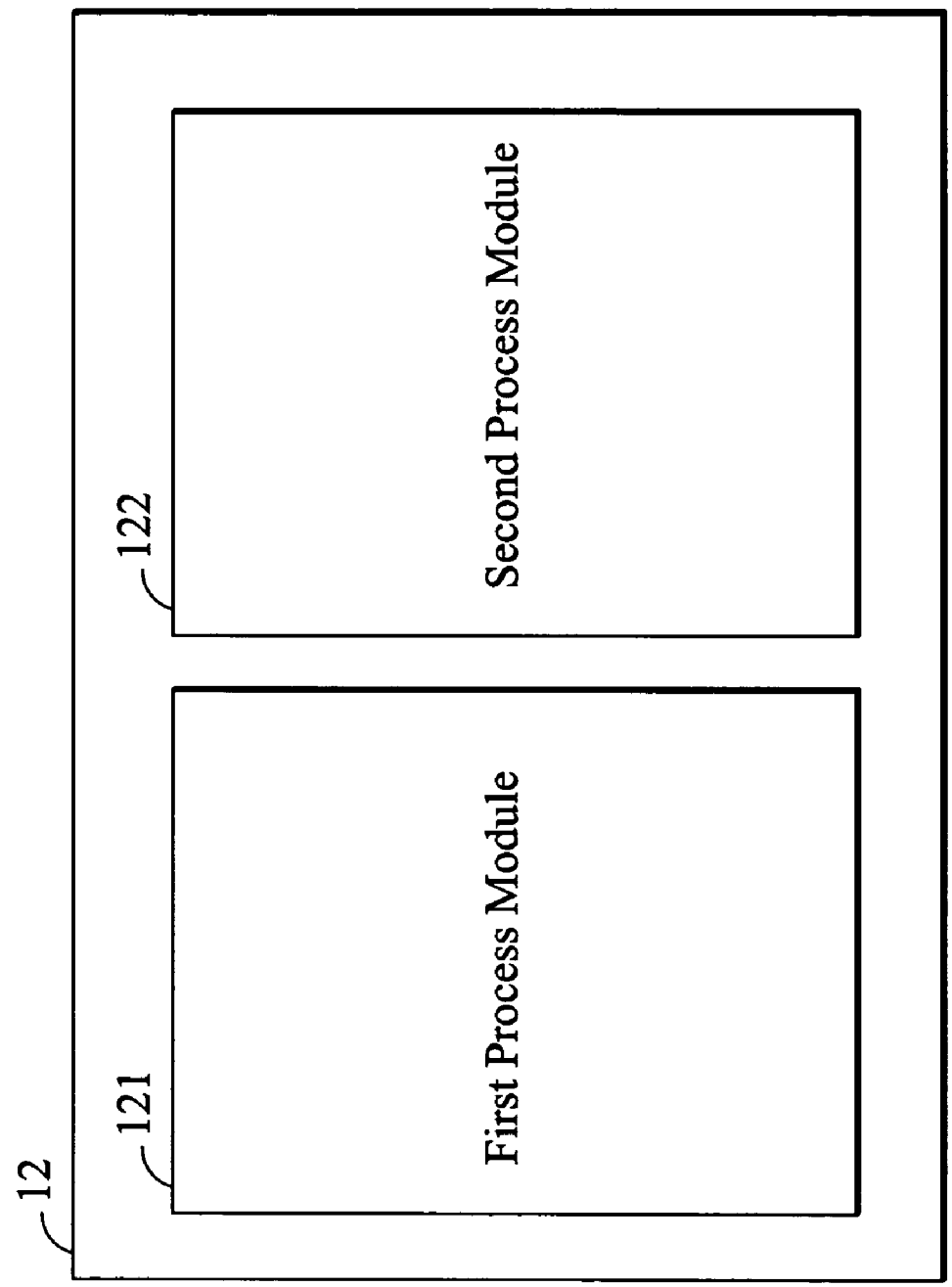
FIG. 3 is a diagram of the software architecture of material transport system according to one embodiment of the invention.

FIG. 3 is a diagram of the software architecture of material transport system according to one embodiment of the invention. The memory 12 is preferably a random access memory (RAM), but may also include read-only memory (ROM) or flash ROM. The memory 12 preferably includes a first process module 121 and a second process module 122, which include routines to perform transport traffic management functions.

The object of both process modules 121 and 122 is to receive an available number of a resource type corresponding to a fabrication tool, acquire both an anticipative carrier identity and a required number of the resource type corresponding to the carrier identity, issue a load command to an automated material handling system (AMHS) if the available number of the resource type exceeds or equals to the required number of the resource type, and conversely, send an advisory to an operator or an automated dispatch system (not shown) if the available number of the resource type is less than the required number of the resource type.

In one scenario with the fabrication tool 12, upon receiving the available control job and process job space from the host computer 11, the first process module 121 acquires identity of an anticipative carrier corresponding to the fabrication tool 12 from an operator or an automated dispatch system (not shown), and the required control job and process job space of the carrier from a manufacturing execution system (MES) (not shown). The first process module 121 subsequently determines whether the required control job and process job space can be accessed by the fabrication tool 12, if so, the first process module 121 issues a load command to the AMHS to transport the carrier to the loadport of the fabrication tool 12. Otherwise, the first process module 121 sends an advisory indicating the fabrication tool 12 may be suffered an exceptional condition to the operator or the automated dispatch system (not shown).

In another scenario with the fabrication tool 14, upon receiving the available control job, process job, and internal buffer space from the host computer 13, the second process module 122 acquires identity of an anticipative carrier corresponding to the fabrication tool 14 from an operator or an automated dispatch system (not shown), and the required control job, process job, and internal buffer space of the carrier from a manufacturing execution system (MES) (not shown). The second process module 122 subsequently determines whether the required control job, process job and internal buffer space can be accessed by the fabrication tool 14, and if so, the second process module 122 issues a load command to the AMHS to transport the carrier to the loadport of the fabrication tool 14. Otherwise, the second process module 122 sends an advisory indicating the fabrication tool 14 may have suffered an exceptional condition to the operator or the automated dispatch system (not shown).

Figure 4:
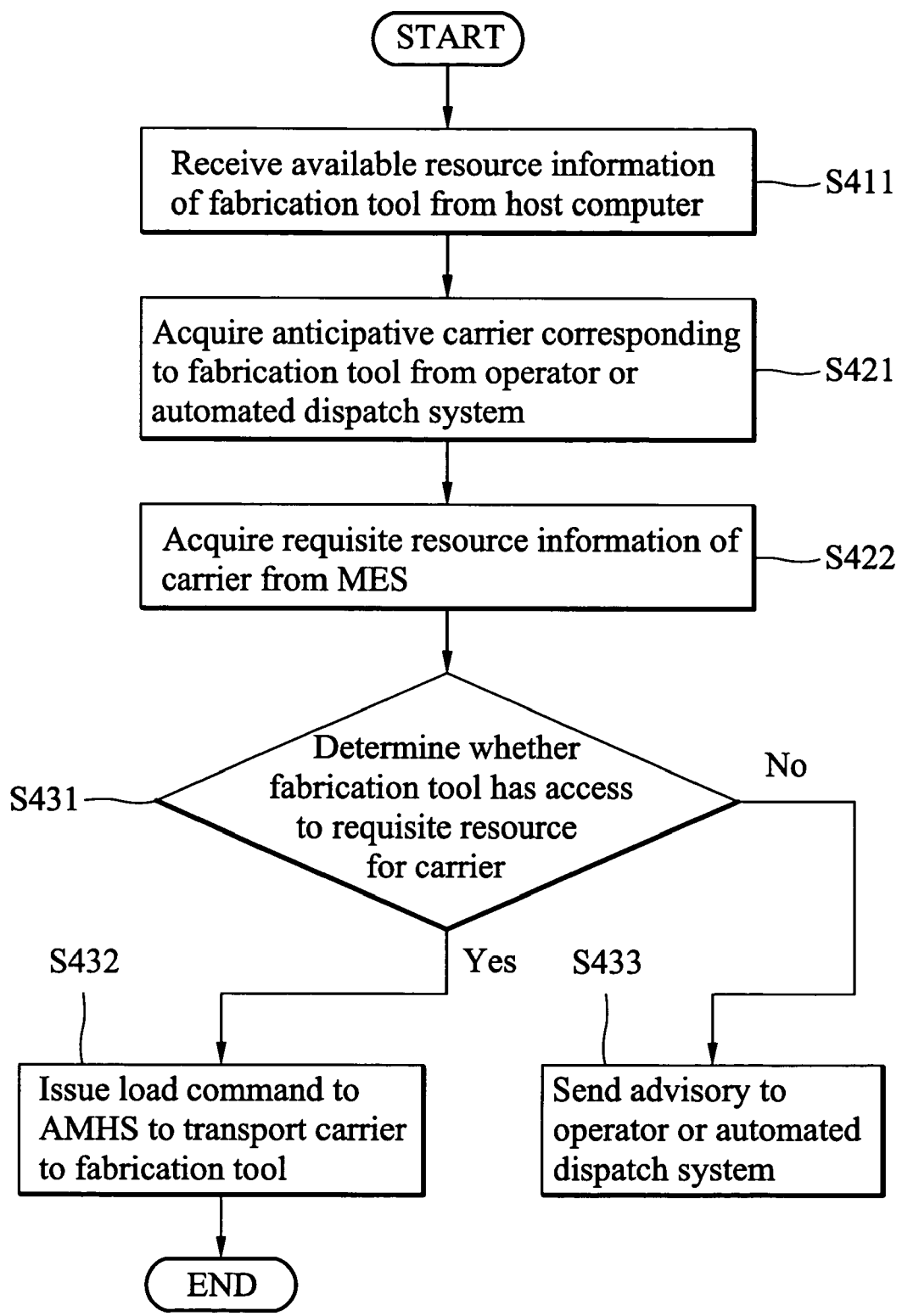
FIG. 4 is a flowchart showing the method of carrier transport traffic management according to the present invention.

FIG. 4 is a flowchart showing the method of carrier transport traffic management according to the present invention. The method begins in step S411 to receive an available number of a resource type, such as a control job space, a process job space, an internal buffer space, or others, corresponding to a fabrication tool from a host computer. In step S421, an anticipative carrier identity corresponding to the fabrication tool is acquired from an operator or an automated dispatch system. In step S422, a required number of the resource type, such as a control job space, a process job space, an internal buffer space, or others, corresponding to the carrier is acquired from the MES.

Subsequently, the process proceeds to step S431 to determine whether the fabrication tool has access to sufficient resource for the carrier by comparing the available number of the resource type with the required number of the resource type, and if so, the process proceeds to step S432; otherwise, the process proceeds to step S433. In step S432, a load command is issued to the AMHS to transport the carrier to the fabrication tool. In step S433, an advisory indicating the fabrication tool may have suffered unexceptional condition to the operator or the automated dispatch system.

Figure 5:
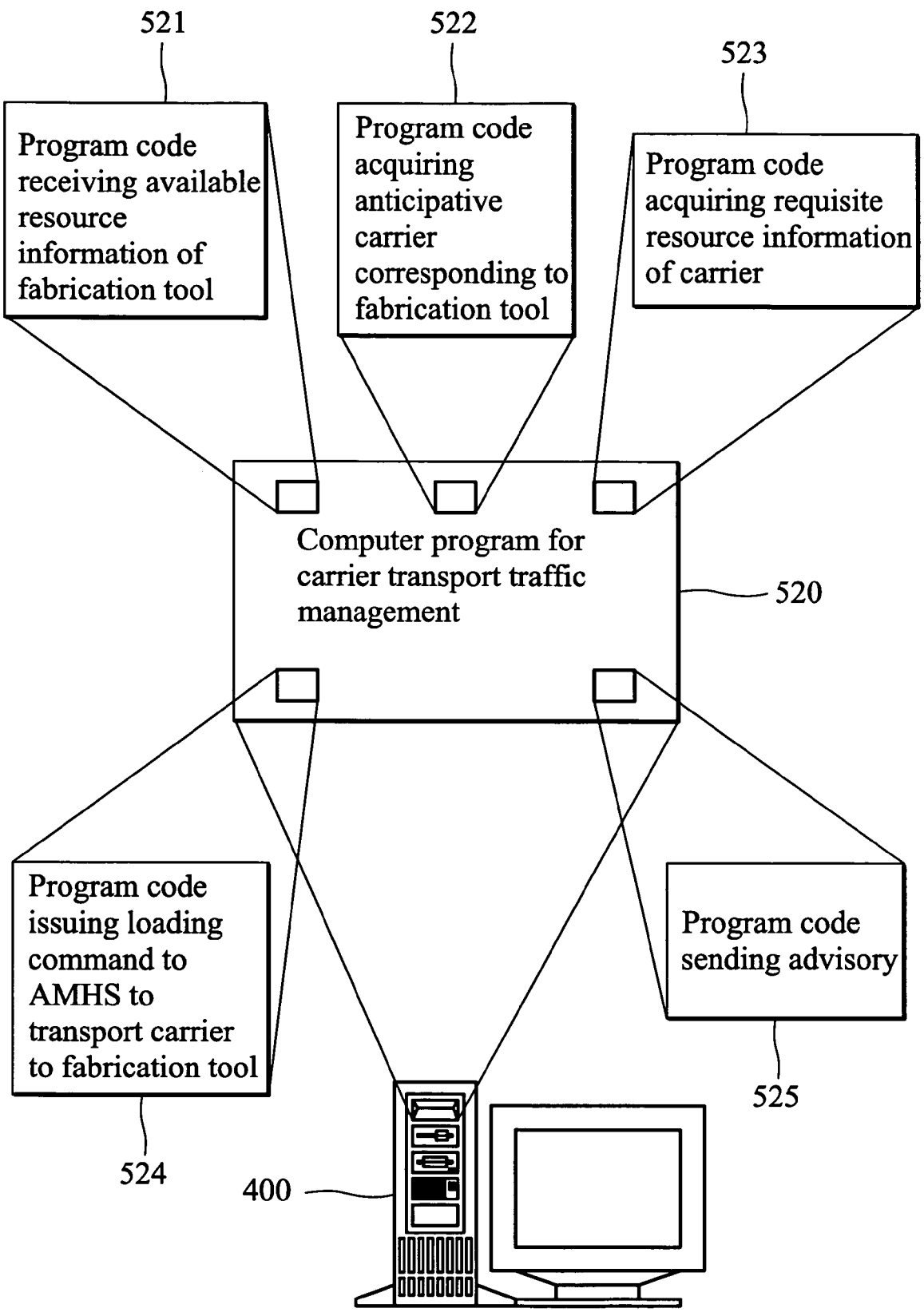
FIG. 5 is a diagram of a storage medium for a computer program providing the method of carrier transport traffic management according to one embodiment of the invention.

The invention additionally discloses a storage medium storing a computer program providing the disclosed method of carrier transport traffic management, as shown in FIG. 5. The storage medium 50 carries computer readable program code embodied in the medium for use in a computer system, the computer readable program code comprising at least computer readable program code 521 receiving an available number of a resource type corresponding to a fabrication tool from a host computer, computer readable program code 522 acquiring an anticipative carrier identity corresponding to a carrier from an operator or an automated dispatch system, computer readable program code 523 acquiring a required number of the resource type corresponding to the carrier identity from an MES, computer readable program code 524 issuing a load command to an AMHS to transport the carrier to the fabrication tool if the fabrication tool has access to sufficient resources for the carrier and computer readable program code 525 sending an advisory indicating the fabrication tool may have suffered an unexceptional condition to the operator or the automated dispatch system if the fabrication tool has access to insufficient resources for the carrier.

The methods and system of the present invention, or certain aspects or portions thereof, may take the form of program code (i.e., instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Although the present invention has been described in its preferred embodiments, it is not intended to limit the invention to the precise embodiments disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A system of carrier transport traffic management, comprising:
    a fabrication tool;
    a host computer, connected to the fabrication tool, configured to acquire an available capacity of control jobs, process jobs or internal buffer sections for the fabrication tool upon detecting a loadport of the fabrication tool is available; and
    a material transport system, connected to the host computer, configured to receive the available capacity of the control jobs, process jobs or internal buffer sections corresponding to the fabrication tool, acquire a carrier identity corresponding to a carrier, acquire a required capacity of the control jobs, process jobs or internal buffer sections corresponding to the carrier, and issue a load command to the transport system to transport the carrier to the fabrication tool if the available capacity of the control jobs, process jobs or internal buffer sections exceeds or equals to the required capacity of the control jobs, process jobs or internal buffer sections.

2. The system of claim 1 wherein the material transport system further sends an advisory to an operator if the available capacity of the control jobs, process jobs or internal buffer sections is less than the required capacity of the control jobs, process jobs or internal buffer sections.

3. The system of claim 1 wherein the fabrication tool provides a plurality of services compliant to a 300 mm semiconductor equipment and material international (SEMI) standard.

4. The system of claim 1 wherein the carrier identity is acquired from an operator.

5. The system of claim 1 wherein the available capacity of control jobs are acquired by executing a software service resident in the fabrication tool, and each control job manages process job sequence of a number of the process jobs.

6. The system of claim 1 wherein the available capacity of process jobs are acquired by executing a software service resident in the fabrication tool, and each process job is provided for association with at least one wafer lot and to specify a particular recipe.

7. The system of claim 1 wherein the internal buffer sections respectively correspond to one of three categories, production, side dummy and fill dummy, the available capacity of internal buffer sections with the corresponding categories are acquired by executing a software service resident in the fabrication tool, and the internal buffer sections will intake, process and store the carrier.

8. A method of carrier transport traffic management, the method comprising using a computer to perform the steps of:
    receiving an available capacity of control jobs, process jobs or internal buffer sections corresponding to a fabrication tool from a host computer;
    acquiring a carrier identity corresponding to a carrier;
    acquiring a required capacity of the control jobs, process jobs or internal buffer sections corresponding to the carrier identity; and
    issuing a load command to a transport system to transport the carrier to the fabrication tool if the available capacity of the control jobs, process jobs or internal buffer sections exceeds or equals to the required capacity of the control jobs, process jobs or internal buffer sections.

9. The method of claim 8 further comprising a step of sending an advisory to an operator if the available capacity of the control jobs, process jobs or internal buffer sections is less than the required capacity of the control jobs, process jobs or internal buffer sections.

10. The method of claim 8 wherein the fabrication tool provides a plurality of services compliant to a 300 mm semiconductor equipment and material international (SEMI) standard.

11. The method of claim 8 wherein the carrier identity is acquired from an operator.

12. The method of claim 8 wherein the available capacity of control jobs are acquired by executing a software service resident in the fabrication tool, and each control job manages process job sequence of a number of the process jobs.

13. The method of claim 8 wherein the available capacity of process jobs are acquired by executing a software service resident in the fabrication tool, and each process job is provided for association with at least one wafer lot and to specify a particular recipe.

14. The method of claim 8 wherein the internal buffer sections respectively correspond to one of three categories, production, side dummy and fill dummy, the available capacity of internal buffer sections with the corresponding categories are acquired by executing a software service resident in the fabrication tool, and the internal buffer sections will intake, process and store the carrier.

15. A machine-readable storage medium for storing a computer program which when executed performs a method of carrier transport traffic management, the method comprising the steps of:
   receiving an available capacity of control jobs, process jobs or internal buffer sections corresponding to a fabrication tool from a host computer;
   acquiring a carrier identity corresponding to a carrier;
   acquiring a required capacity of the control jobs, process jobs or internal buffer sections corresponding to the carrier identity; and
   issuing a load command to a transport system to transport the carrier to the fabrication tool if the available capacity of the control jobs, process jobs or internal buffer sections exceeds or equals to the required capacity of the control jobs, process jobs or internal buffer sections.

16. The machine-readable storage medium of claim 15, wherein the method farther comprises a step of sending an advisory to an operator if the available capacity of the control jobs, process jobs or internal buffer sections is less than the required capacity of the control jobs, process jobs or internal buffer sections.

17. The computer-readable storage medium of claim 15 wherein the carrier identity is acquired from an operator.

18. The computer-readable storage medium of claim 15 wherein the available capacity of control jobs are acquired by executing a software service resident in the fabrication tool, and each control job manages process job sequence of a number of the process jobs.

19. The computer-readable storage medium of claim 15, wherein the available capacity of process jobs are acquired by executing a software service resident in the fabrication tool, and each process job is provided for association with at least one wafer lot and to specify a particular recipe.

20. The computer-readable storage medium of claim 15, wherein the internal buffer sections respectively correspond to one of three categories, production, side dummy and fill dummy, the available capacity of internal buffer sections with the corresponding categories are acquired by executing a software service resident in the fabrication tool, and the internal buffer sections will intake, process and store the carrier.

* * * * *